US006953697B1

(12) United States Patent
Castle et al.

(10) Patent No.: US 6,953,697 B1
(45) Date of Patent: Oct. 11, 2005

(54) ADVANCED PROCESS CONTROL OF THE MANUFACTURE OF AN OXIDE-NITRIDE-OXIDE STACK OF A MEMORY DEVICE, AND SYSTEM FOR ACCOMPLISHING SAME

(75) Inventors: Howard E. Castle, Austin, TX (US); Robert J. Chong, Austin, TX (US); Brian K. Cusson, Austin, TX (US); Eric O. Green, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/277,357

(22) Filed: Oct. 22, 2002

(51) Int. Cl.[7] .......................................... H01L 21/8247
(52) U.S. Cl. .......................... 438/7; 438/10; 438/261; 438/954
(58) Field of Search ........................ 438/257–267, 438/954, 7, 10

(56) References Cited

U.S. PATENT DOCUMENTS 6,072,191 A * 6/2000 La et al. ..................... 257/48
6,372,577 B1 4/2002 Fang ........................... 438/258
6,589,804 B1 * 7/2003 Halliyal et al. ............... 438/22

* cited by examiner

*Primary Examiner*—Richard A. Booth
(74) *Attorney, Agent, or Firm*—Williams, Morgan & Amerson, P.C.

(57) ABSTRACT

The present invention is generally directed to an advanced process control of the manufacture of memory devices, and a system for accomplishing same. In one illustrative embodiment, the method comprises performing at least one process operation to form at least one layer of an oxide-nitride-oxide stack of a memory cell, the stack being comprised of a first layer of oxide positioned above a first layer of polysilicon, a layer of silicon nitride positioned above the first layer of oxide, and a second layer of oxide positioned above the layer of silicon nitride. The method further comprises measuring at least one characteristic of at least one of the first layer of polysilicon, the first oxide layer, the layer of silicon nitride, and the second layer of oxide and adjusting at least one parameter of at least one process operation used to form at least one of the first oxide layer, the layer of silicon nitride and the second oxide layer if the measured at least one characteristic is not within acceptable limits.

50 Claims, 2 Drawing Sheets

ADVANCED PROCESS CONTROL OF THE MANUFACTURE OF AN OXIDE-NITRIDE-OXIDE STACK OF A MEMORY DEVICE, AND SYSTEM FOR ACCOMPLISHING SAME

BACKGROUND OF THE INVENTION

1. Field of the Invention

The present invention is generally related to semiconductor manufacturing, and, more particularly, to advanced process control methodologies for the manufacture of an oxide-nitride-oxide stack of a memory device, and various systems for accomplishing same.

2. Description of the Related Art

Semiconductor manufacturers have increasingly turned to high density flash memory arrays in their integrated circuit design schemes. A flash memory array includes columns of active regions that are separated by columns of insulating field oxide regions. The transistors are spaced apart in the active regions and each row of transistors are bits in a memory word. The transistors are formed with various materials including a type-1 layer of polysilicon, and transistors forming a row in the array are connected by a word-line comprising a type-2 layer of polysilicon.

To achieve a high density integrated circuit, the transistors must be as small as possible. Typically, these high density flash memory integrated circuits utilize NAND-type gates as opposed to NOR-type gates since NAND gates have a considerably higher density than NOR gates. Smaller transistors allow more transistors to be placed on a single substrate, thereby allowing relatively large circuit systems to be incorporated on a single, relatively small die area.

These memory devices are used to store ever-increasing amounts of data that is generated or used during the operation of modern consumer devices. The market for such memory devices is very competitive. Manufacturers of such devices are constantly searching for ways to improve product yields, reduce costs and reduce fabrication cycle times. Moreover, there is a constant drive to increase the performance capabilities of such memory devices, such as storage capabilities, erase times, etc.

FIG. 1 is a cross-sectional view of a portion of a memory cell 10. In practice, a memory array may be comprised of thousands of the memory cells 10. A plurality of field isolation regions 19, e.g., so-called field oxide regions, are formed in the substrate 11. These field isolation regions may be trench isolation regions or they may be a grown area of oxide that is formed by a LOCOS process. Each memory cell 10 is formed above an active area 11A of the substrate 11 between adjacent field isolation regions 19. The memory cell 10 is comprised of a gate insulation layer 16, which is sometimes referred to as a tunnel oxide layer, a floating gate electrode 18, a composite inter-poly insulation layer 20, and a control gate electrode 22. The composite inter-poly insulation layer 20 may be comprised of a layer of silicon dioxide 20A, a layer of silicon nitride 20B and a layer of silicon dioxide 20C. Such a combination is sometimes referred to as an oxide-nitride-oxide (ONO) layer or stack. The floating gate electrode 18 and the control gate electrode 22 may be made of, for example, polysilicon.

Many different process steps are employed in manufacturing the portion of the memory cell 10 depicted in FIG. 1. For example, such processes include various deposition steps, various thermal growth processes and various masking and etching operations. Given the continual drive to increase the performance capabilities of such memory cells 10, each aspect of the manufacture of the various portions of the memory cell 10 may have a bearing on the ultimate capabilities of the memory cell 10, as well as integrated circuit products incorporating such memory cells 10. The ability to control the manufacturing process used to form such memory cells 10 so as to produce memory cells 10 meeting desired levels of performance is very desirable.

The present invention is directed to a device and various methods that may solve, or at least reduce, some or all of the aforementioned problems.

SUMMARY OF THE INVENTION

The present invention is generally directed to an advanced process control of the manufacture of an oxide-nitride-oxide stack of a memory device, and various systems for accomplishing same. In one illustrative embodiment, the method comprises performing at least one process operation to form at least one layer of an oxide-nitride-oxide stack of a memory cell, the stack being comprised of a first layer of oxide positioned above a first layer of polysilicon, a layer of silicon nitride positioned above the first layer of oxide, and a second layer of oxide positioned above the layer of silicon nitride. The method further comprises measuring at least one characteristic of at least one of the first layer of polysilicon, the first oxide layer, the layer of silicon nitride, and the second layer of oxide and adjusting at least one parameter of at least one process operation used to form at least one of the first oxide layer, the layer of silicon nitride and the second oxide layer if the measured at least one characteristic is not within acceptable limits.

In another illustrative embodiment, the method comprises performing at least one process operation to form a first oxide layer, a layer of silicon nitride and a second oxide layer of an oxide-nitride-oxide stack of a memory cell, measuring at least one characteristic of the oxide-nitride-oxide stack and adjusting at least one parameter of a process operation to be performed to form at least one layer of an oxide-nitride-oxide stack above a subsequently processed substrate based upon the measured characteristic of the measured oxide-nitride-oxide stack.

BRIEF DESCRIPTION OF THE DRAWINGS

The invention may be understood by reference to the following description taken in conjunction with the accompanying drawings, in which like reference numerals identify like elements, and in which.

Figure 1:
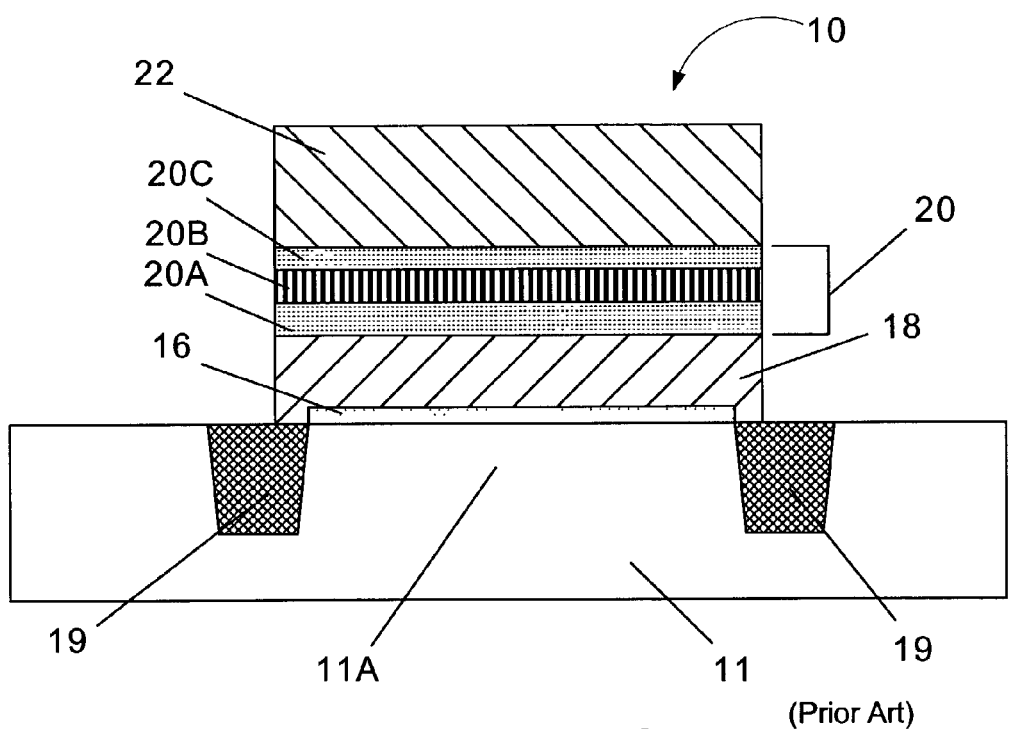
FIG. 1 depicts a portion of an illustrative prior art memory device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Moreover, the systems depicted herein do not include all of the various supporting utilities and equipment that may be part of a real-world functioning system. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to advanced process control methodologies for the manufacture of an oxide-nitride-oxide stack of a memory device, and various systems for accomplishing same. After a complete reading of the present application that the present invention, those skilled in the art will recognize that the present invention may be employed with respect to a variety of technologies, e.g., NMOS, PMOS, CMOS, etc., and it may be employed with a variety of different types of devices. Moreover, it may be employed in the context of integrated circuit devices that may be used in a variety of consumer products, such as a personal computer, a portable computer, a mobile telephone, a digital camera, a personal digital assistant and a wireless internet appliance. Thus, the present invention should not be considered as limited to any particular type of integrated circuit device, technology or consumer product unless such limitations are clearly set forth in the appended claims.

An exemplary process flow that may be used to form the memory cell 10 depicted in FIG. 1 will now be discussed. However, as will be understood by those skilled in the art after a complete reading of the present application, the present invention is not limited to any particular process flow. Thus, the present invention should be understood as having broad applicability, and it should not be considered as limited to any particular process flow or to any of the structural details of the memory cell 10 recited herein, unless such limitations are clearly set forth in the appended claims.

To form the portion of the memory cell 10 depicted in FIG. 1, the trench isolation regions 19 are initially formed in the substrate 11 by using a variety of known techniques. The next process involves the formation of the insulation layer 16, e.g., the so-called tunnel oxide layer 16. The insulation layer 16 may be comprised of a variety of materials, such as silicon dioxide and nitrogen-doped silicon dioxide. The insulation layer 16 may be formed by a variety of techniques, such as thermal oxidation, chemical vapor deposition (CVD), etc. Prior to the formation of the insulation layer 16 on the surface of the substrate 11, a pre-clean operation is performed with a dilute acid, such as a dilute HF acid or an RCA (4 chemistry) type clean. In one illustrative example, the insulation layer 16 is comprised of silicon dioxide, and it is formed by a thermal growth process to a thickness that ranges from approximately 5–20 nm (50–200 Å).

The next process involves the deposition of a layer of polysilicon (not shown) above the substrate 11 and the field isolation regions 19. This layer of polysilicon, a so-called poly-one layer, may be formed by performing a variety of processes, e.g., CVD, plasma enhanced chemical vapor deposition (PECVD), low pressure chemical vapor deposition (LPCVD), etc. The layer of polysilicon may be doped or undoped depending upon the particular application. The thickness of the layer of polysilicon may also vary. For example, the nominal thickness of the layer of polysilicon may be approximately 90 nm (900 Å).

The next operation involves performing masking and etching processes on the layer of polysilicon to define the floating gate electrode 18 positioned between the field isolation regions 19. The floating gate electrode 18 may have a thickness that ranges from approximately 50–150 nm (500–1500 Å). Standard photolithography and etching tools and processes may be used in etching the layer of polysilicon to define the floating gate 18.

Thereafter, various processing operations may be performed to form the composite inter-poly insulation layer 20 and the control gate electrode 22. For example, the first oxide layer 20A may be formed to a thickness of approximately 4–6 nm (40–60 Å) by performing a deposition process, such as a low pressure chemical vapor deposition (LPCVD) process. Thereafter, the silicon nitride layer 20B may be formed to a thickness of approximately 7.5–9.5 nm (75–95 Å) by performing a deposition process, such as an LPCVD process. The second oxide layer 20C, the so-called top oxide layer, may be formed to a thickness of approximately 3.5–3.7 (35–37 Å) by performing a high temperature thermal growth process. After the layers 20A, 20B and 20C are formed, they may be etched using a traditional masking techniques and one or more anisotropic etching processes.

Thereafter, as it relates to the formation of a memory device, a second layer of polysilicon (not shown), i.e., the second poly layer, is then formed above the "ONO" stack 20 by performing a deposition process, such as an LPCVD process. A variety of oxidation processes may be performed prior to forming the second poly layer, although such processes will not affect the memory device. The second layer of polysilicon may have a thickness of approximately 250 nm (2500 Å). The second layer of polysilicon may then be patterned using traditional masking and etching techniques to define the control gate electrode 22. However, it should also be understood that the control gate electrode 22 may be comprised of a variety of materials, such as polysilicon, a metal, e.g., tungsten, or a metal silicide, e.g., cobalt silicide, nickel silicide, platinum silicide, titanium silicide, etc. Various known ion implant processes may also be performed in forming the completed memory device. U.S. Pat. No. 6,372,577, which is assigned to Advanced Micro Devices, provides various examples of the processes and procedures that may be used to complete the formation of the memory cell device. U.S. Pat. No. 6,372,577 is hereby incorporated by reference in its entirety.

The various components of the memory cell 10 may have an impact on device performance. For example, the thickness of the floating gate electrode 18, the first oxide layer 20A, the silicon nitride layer 20B and the second oxide layer 20C may have an impact on the ultimate performance of the memory cell 10, as well as integrated circuit devices incorporating such memory cells. Additionally, the dielectric constant (k) of the individual layer 20A, 20B and 20C, as well as the dielectric constant (k) of the overall ONO stack 20, may have an impact on the ability of the memory cell 10 to meet pre-established performance characteristics. As an even more specific example, the thickness, dielectric constant (k) and quality of the first oxide layer 20A may have an on the erase time of the memory cell 10. A variety of parameters or characteristics of the various layers that make up the memory cell 10 may impact the performance of the memory cell. Such parameters include, but should not be considered as limited to, the thickness of the individual layers, the dielectric value of the individual layers, the overall thickness of the ONO stack 20, the effective dielectric value of two or more of the layers that make up the ONO stack, the uniformity of each of the individual layers, the amount of dopant in the floating gate electrode 18, the sheet resistance of the floating gate electrode 18 and the control gate 22, and the temperature and/or pressure of various thermal growth or deposition process used in forming the various layers that make up the memory cell 10. These parameters may also include the refractive index, capacitance, extinction coefficient and/or flat band voltage of the overall ONO stack or the individual layers that make up the stack.

Figure 2:
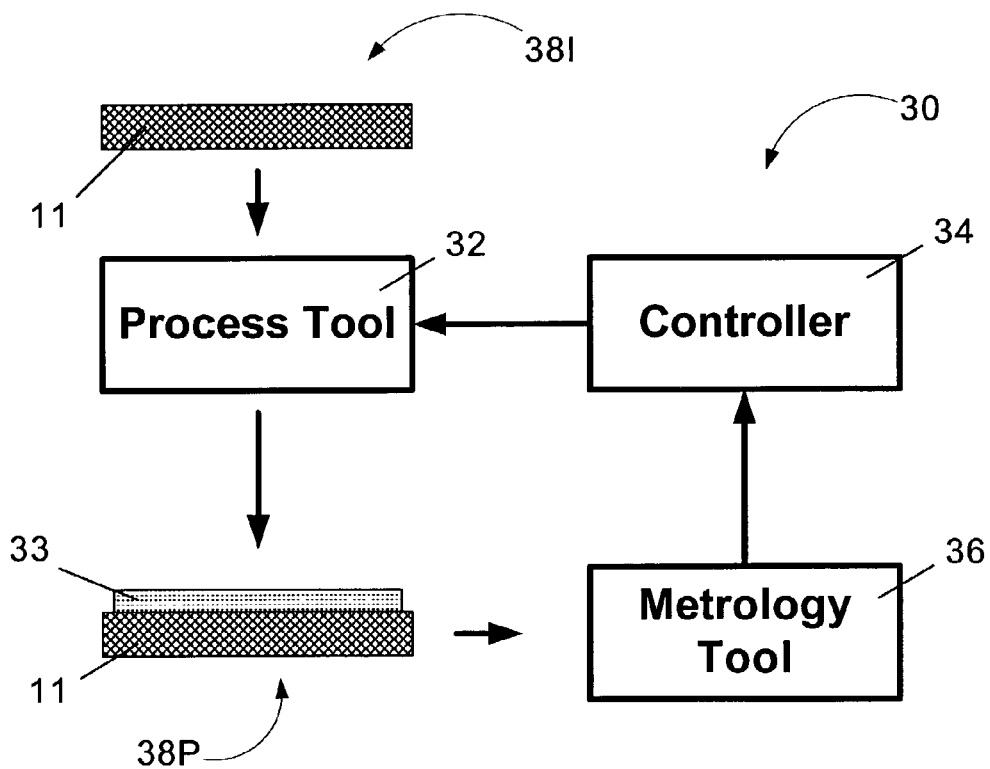
FIG. 2 is a block diagram depiction of an illustrative embodiment of a system that may be employed with the present invention.

FIG. 2 is a block diagram depiction of an illustrative system 30 in accordance with one embodiment of the present invention. The system 30 may be employed in performing the various methods described herein. The system 30 is generally comprised of a process tool 32, a controller 34 and a metrology tool 36. A plurality of incoming substrates 38I have at least one process operation performed on them in the process tool 32, and they exit the process tool 32 as processed substrates 38P. The substrates 38I and 38P are intended to be representative in nature in that they each may represent one or more substrates. Moreover, it should be understood that memory cells, like the memory cell 10 depicted in FIG. 1, may be at various stages of manufacture when they are processed in the process tool 32. In the illustrative example depicted in FIG. 2, a process layer 33 has been formed above the substrate 11 in the process tool 32.

The process tool 32 may be any of a variety of different type of process tools depending upon the portion of the memory cell 10 under construction. For example, in the situation where the tunnel oxide layer 16 is being formed, the process tool 32 may be a traditional furnace that is used in performing an oxidation process to form the tunnel oxide layer 16. In the case of formation of the first polysilicon layer, which will be patterned to define the floating gate electrode 18, or formation of the second polysilicon layer, which will be patterned to define the control gate electrode 22, the process tool 32 may be a deposition tool or chamber, such as an LPCVD tool. Additionally, the process tool 32 may also be a deposition tool, e.g., an LPCVD tool or a CVD tool in the context of the formation of the first oxide layer 20A and the second nitride layer 20B. In the context of forming the second or top oxide layer 20C, the process tool 32 may be a high temperature oxidation furnace, or a deposition tool if the second oxide layer 20C is formed by a deposition process. Thus, as will be recognized by those skilled in the art, the present invention may be employed with a variety of different process tools. Accordingly, the present invention should not be considered as limited to any particular tool of processes disclosed herein unless such limitations are expressly set forth in the appended claims.

The metrology tool 36 may be any of a variety of different types of metrology tools depending upon the particular portion of the memory cell 10 subjected to a metrology process, the type of measurement to be performed, and the measured parameter. For example, the metrology tool 36 may be adapted to measure the thickness of one or more of the various layers that comprise the memory cell 10. In that situation, an optical measurement tool may be used in determining the thickness of one or more of the layers of material, e.g., the floating gate electrode 18, the silicon nitride layer 20b, the second oxide layer 20C, etc. In short, the metrology tool 36 may be any type of tool capable of providing metrology data on any of a variety of different types of data for the material layers that comprise the memory cell 10. Such data may include, but should not be considered as limited to, layer thickness, the dielectric constant of a layer of the stack, layer uniformity, dopant concentrations, refractive index, capacitance, extinction coefficient, flat band voltage, or other parameters/characteristics identified earlier.

In the illustrated embodiments, the controller 34 is a computer programmed with software to implement the functions described herein. Moreover, the functions described for the controller 34 may be performed by one or more controllers spread through the system. For example, the controller 34 may be a fab level controller that is used to control processing operations throughout all or a portion of a semiconductor manufacturing facility. Alternatively, the controller 34 may be a lower level computer that controls only portions or cells of the manufacturing facility. Moreover, the controller 34 may be a stand-alone device, or it may reside on the process tool 32 or the metrology tool 36, depending upon the particular application. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 34, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

In one illustrative embodiment, substrates 38P that have been processed in the process tool 32 are provided to the metrology tool 36 where a variety of different types of metrology data may be acquired. In turn, the acquired metrology data is provided to the controller 34. If the metrology data does not fall within acceptable limits, the controller 34 may adjust one or more parameters of the process operation to be performed in the process tool 32 on subsequently processed substrates. That is, a feedback loop may be established such that, based upon the metrology data obtained by the metrology tool 36, one or more parameters of the process performed in the process tool 32 may be adjusted such that substrates that are subsequently processed in the process tool 32 may be maintained in accordance with a desired target value, or range of acceptable values.

For example, the metrology tool 36 may be used to determine if the overall thickness of the completed ONO stack 20, i.e., layers 20A, 20B and 20C, is greater than that allowed by some preselected range of allowable limits. In that situation, the controller 34 may act to adjust one or more parameters of the deposition and/or growth process used in forming the various layers 20A, 20B, 20C such that the overall thickness of the ONO stack 20 is within acceptable limits. This may be accomplished by adjusting the thickness of one, two or all three layers of the ONO stack 20. Similar control methodologies may be applied with respect to a parameter of an individual layer, e.g., thickness, permittivity, etc.

Figure 3:
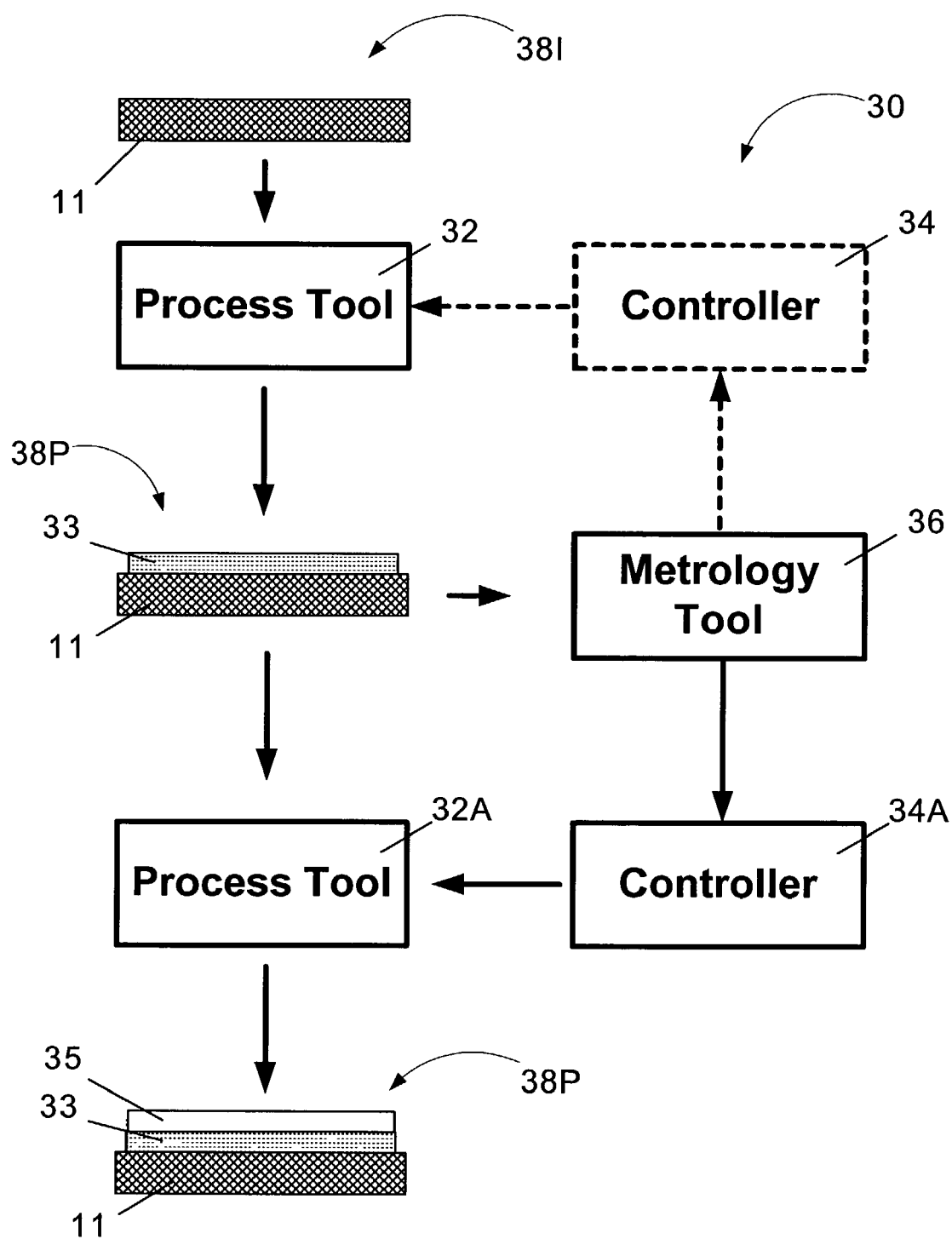
FIG. 3 is a block diagram depiction of another embodiment of an illustrative system that may be employed with the present invention.

In another illustrative embodiment, the present invention may be employed in an effort to compensate for variations in upstream process operations. FIG. 3 is a schematic depiction of an illustrative system that may be employed in performing such methodologies. As shown therein, the system 30 is comprised of a process tool 32A, a controller 34A and the metrology tool 36. In the depicted embodiment, after processing is completed in the upstream process tool 32, processed substrates 38P are provided to the metrology tool 36 where a variety of different types of metrology data may be acquired. The metrology data acquired by the metrology tool 36 is then provided to the controller 34A. If the metrology data indicates that, at that stage of manufacture, a component of the memory cell, e.g., layer 33, is not within product specifications, e.g., it is too thick or its uniformity is unacceptable, the controller 34A may then adjust one or more parameters of the process to be performed in the process tool 32A, where the process layer 35 will be formed above the process layer 33, in an effort to compensate for the variations in the layer 33. That is, the metrology data may be fed forward in an effort to compensate for upstream process variations. By way of example, after the first oxide layer 20A is formed, the metrology tool 36 may be used to determine a parameter of the layer 20A, such as thickness. If it is determined that the thickness of the layer 20A is greater than allowed by a preselected criteria, the controller 34A may act to increase the thickness of one or both of the layers 20B, 20C formed in one or more downstream process tools 32A in an effort to maintain the overall thickness of the ONO stack 20 in accordance with a target value, or a preselected range of acceptable values. As another example, the overall effective dielectric constant of the combined ONO stack 20 may be used as a control. That is, based upon the measured thickness of the first oxide layer 20A and the layer of silicon nitride 20B, the thickness of the second oxide layer 20C may be adjusted such that the effective dielectric constant of the overall ONO stack 20 is maintained within acceptable limits.

The present invention may be employed in either a feedback mode of operation, a feed forward mode of operation, or both. Thus, in FIG. 3, the controller 34 is depicted in dashed lines to indicate that both feed forward and feedback control may be employed in the context of the present invention. Moreover, although there are two separate controllers 34, 34A depicted in FIG. 3, a single controller may be employed to perform the functions described for both of the controllers 34, 34A.

As set forth previously, the controller 34 may, in certain cases, adjust one or more parameters of the process operation in the process tool 32 depending upon the results of the metrology data acquired by the metrology tool 36. The parameters adjusted may vary depending upon the type of process tool 32 employed, the particular process recipe run in the process tool 32, and the desired adjustment to be made. In one illustrate embodiment where the process tool 32 is a deposition tool, such as an LPCVD tool, the parameters of the process that may potentially be adjusted include the process duration, temperature, wafer position, power, the process gas flow rates, the process gas composition, etc. In the case of a thermal oxidation tool, the process variables that may be controlled include the oxidation ambient, the process duration, temperature and pressure, the location of the substrate within the oxidation chamber, etc. In the case where the process tool 32 is an ion implant tool that is used to implant dopant atoms into one or more of the material layers, e.g., the floating gate electrode 18, the parameters that may be controlled include the dopant dose and/or the implant energy.

The present invention is generally directed to an advanced process control of the manufacture of an oxide-nitride-oxide stack of a memory device, and various systems for accomplishing same. In one illustrative embodiment, the method comprises performing at least one process operation to form at least one layer of an oxide-nitride-oxide stack of a memory cell, the stack being comprised of a first layer of oxide positioned above a first layer of polysilicon, a layer of silicon nitride positioned above the first layer of oxide, and a second layer of oxide positioned above the layer of silicon nitride. The method further comprises measuring at least one characteristic of at least one of the first layer of polysilicon, the first oxide layer, the layer of silicon nitride, and the second layer of oxide and adjusting at least one parameter of at least one process operation used to form at least one of the first oxide layer, the layer of silicon nitride and the second oxide layer if the measured at least one characteristic is not within acceptable limits.

In another illustrative embodiment, the method comprises performing at least one process operation to form a first oxide layer, a layer of silicon nitride and a second oxide layer of an oxide-nitride-oxide stack of a memory cell, measuring at least one characteristic of the oxide-nitride-oxide stack and adjusting at least one parameter of a process operation to be performed to form at least one layer of an oxide-nitride-oxide stack above a subsequently processed substrate based upon the measured characteristic of the measured oxide-nitride-oxide stack.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing at least one process operation to form at least one layer of an oxide-nitride-oxide stack of a memory cell, said stack being comprised of a first layer of oxide positioned above a first layer of polysilicon, a layer of silicon nitride positioned above said first layer of oxide, and a second layer of oxide positioned above said layer of silicon nitride;
    measuring a refractive index of at least one of said first layer of polysilicon, said first oxide layer, said layer of silicon nitride, and said second layer of oxide; and
    adjusting at least one parameter of at least one process operation used to form at least one of said first oxide layer, said layer of silicon nitride and said second oxide layer if said measured refractive index is not within acceptable limits.

2. The method of claim 1, wherein performing at least one process operation comprises performing a deposition process to form said first layer of oxide.

3. The method of claim 1, wherein performing at least one process operation comprises performing a deposition process to form said layer of silicon nitride.

4. The method of claim 1, wherein performing at least one process operation comprises performing a thermal growth process to form said second layer of oxide.

5. The method of claim 1, further comprising measuring a capacitance of at least one of said first oxide layer, said layer of silicon nitride and said second layer of oxide.

6. The method of claim 1, wherein measuring a refractive index of at least one of said first layer of polysilicon, said first oxide layer, said layer of silicon nitride, and said second layer of oxide comprises measuring a refractive index of a combination comprised of at least two of said first layer of oxide, said layer of silicon nitride and said second layer of oxide.

7. The method of claim 1, wherein measuring a refractive index of at least one of said first layer of polysilicon, said first oxide layer, said layer of silicon nitride, and said second layer of oxide comprises measuring a refractive index of a combination comprised of said first layer of oxide, said layer of silicon nitride and said second layer of oxide.

8. The method of claim 1, further comprising measuring at least one of a sheet resistance and a dopant concentration level of said first layer of polysilicon.

9. The method of claim 1, further comprising performing said at least one process with said at least one adjusted parameter to form at least one of a first oxide layer, a layer of silicon nitride, and a second layer of oxide on a subsequently process substrate.

10. A method, comprising:
    performing at least one process operation to form a first oxide layer of an oxide-nitride-oxide stack of a memory cell;
    measuring a refractive index of said first oxide layer; and
    adjusting at least one parameter of a process operation to be performed to form at least one of a layer of silicon nitride and a second layer of oxide above said first oxide layer based upon said measured refractive index of said first oxide layer.

11. The method of claim 10, further comprising measuring a capacitance of said first oxide layer.

12. The method of claim 10, wherein adjusting at least one parameter of a process operation to be performed to form at least one of a layer of silicon nitride and a second layer of oxide above said first oxide layer based upon said measured refractive index of said first oxide layer comprises adjusting at least one of a temperature, a pressure and a duration of a deposition process used to form said layer of silicon nitride above said first oxide layer.

13. The method of claim 10, wherein adjusting at least one parameter of a process operation to be performed to form at least one of a layer of silicon nitride and a second layer of oxide above said first oxide layer based upon said measured refractive index of said first oxide layer comprises adjusting at least one of a temperature, a duration of a thermal growth process used to form said second layer of silicon oxide above said layer of silicon nitride.

14. A method, comprising:
    performing at least one process operation to form a layer of silicon nitride above a first layer of oxide of an oxide-nitride-oxide stack of a memory cell;
    measuring a refractive index of said layer of silicon nitride; and
    adjusting at least one parameter of a process operation to be performed to form a second layer of oxide above said layer of silicon nitride based upon said measured refractive index of said layer of silicon nitride.

15. The method of claim 14, further comprising measuring a capacitance of said layer of silicon nitride.

16. The method of claim 14, wherein adjusting at least one parameter of a process operation to be performed to form said second layer of oxide above said layer of silicon nitride based upon said measured refractive index of said layer of silicon nitride comprises adjusting at least one of a temperature, a pressure and a duration of a thermal growth process used to form said second layer of oxide above said layer of silicon nitride.

17. A method, comprising:
    performing at least one process operation to form a first oxide layer, a layer of silicon nitride and a second oxide layer of an oxide-nitride-oxide stack of a memory cell;
    measuring a refractive index of said oxide-nitride-oxide stack; and
    adjusting at least one parameter of a process operation to be performed to form at least one layer of an oxidenitride-oxide stack above a subsequently processed substrate based upon said measured refractive index of said measured oxide-nitride-oxide stack.

18. The method of claim 17, further comprising measuring a capacitance of said oxide-nitride-oxide stack.

19. The method of claim 17, wherein adjusting at least one parameter of a process operation to be performed to form at least one layer of an oxide-nitride-oxide stack to be formed above a subsequently processed substrate comprises adjusting at least one of a temperature, a pressure and a duration of a deposition process or a thermal growth process.

20. The method of claim 1, further comprising measuring an extinction coefficient of at least one of said first oxide layer, said layer of silicon nitride and said second layer of oxide.

21. The method of claim 1, further comprising measuring a flat band voltage of at least one of said first oxide layer, said layer of silicon nitride and said second layer of oxide.

22. The method of claim 1, further comprising measuring an extinction coefficient of a combination comprised of at least two of said first layer of oxide, said layer of silicon nitride and said second layer of oxide.

23. The method of claim 1, further comprising measuring a flat band voltage of a combination comprised of at least two of said first layer of oxide, said layer of silicon nitride and said second layer of oxide.

24. The method of claim 1, further comprising measuring an extinction coefficient of a combination comprised of said first layer of oxide, said layer of silicon nitride and said second layer of oxide.

25. The method of claim 1, further comprising measuring a flat band voltage of a combination comprised of said first layer of oxide, said layer of silicon nitride and said second layer of oxide.

26. A method, comprising:
performing at least one process operation to form at least one layer of an oxide-nitride-oxide stack of a memory cell, said stack being comprised of a first layer of oxide positioned above a first layer of polysilicon, a layer of silicon nitride positioned above said first layer of oxide, and a second layer of oxide positioned above said layer of silicon nitride;
measuring a capacitance of at least one of said first layer of polysilicon, said first oxide layer, said layer of silicon nitride, and said second layer of oxide; and
adjusting at least one parameter of at least one process operation used to form at least one of said first oxide layer, said layer of silicon nitride and said second oxide layer if said measured capacitance is not within acceptable limits.

27. The method of claim 26, wherein performing at least one process operation comprises performing a deposition process to form said first layer of oxide.

28. The method of claim 26, wherein performing at least one process operation comprises performing a deposition process to form said layer of silicon nitride.

29. The method of claim 26, wherein performing at least one process operation comprises performing a thermal growth process to form said second layer of oxide.

30. The method of claim 26, further comprising measuring a refractive index of at least one of said first layer of polysilicon, said first oxide layer, said layer of silicon nitride, and said second layer of oxide.

31. The method of claim 26, wherein measuring a capacitance of at least one of said first layer of polysilicon, said first oxide layer, said layer of silicon nitride, and said second layer of oxide comprises measuring a capacitance of a combination comprised of at least two of said first layer of oxide, said layer of silicon nitride and said second layer of oxide.

32. The method of claim 26, wherein measuring a capacitance of at least one of said first layer of polysilicon, said first oxide layer, said layer of silicon nitride, and said second layer of oxide comprises measuring a capacitance of a combination comprised of said first layer of oxide, said layer of silicon nitride and said second layer of oxide.

33. The method of claim 26, further comprising measuring at least one of a sheet resistance and a dopant concentration level of said first layer of polysilicon.

34. The method of claim 26, further comprising performing said at least one process with said at least one adjusted parameter to form at least one of a first oxide layer, a layer of silicon nitride, and a second layer of oxide on a subsequently process substrate.

35. A method, comprising:
performing at least one process operation to form a first oxide layer of an oxide-nitride-oxide stack of a memory cell;
measuring a capacitance of said first oxide layer; and
adjusting at least one parameter of a process operation to be performed to form at least one of a layer of silicon nitride and a second layer of oxide above said first oxide layer based upon said measured capacitance of said first oxide layer.

36. The method of claim 35, further comprising measuring a refractive index of said first oxide layer.

37. The method of claim 35, wherein adjusting at least one parameter of a process operation to be performed to form at least one of a layer of silicon nitride and a second layer of oxide above said first oxide layer based upon said measured capacitance of said first oxide layer comprises adjusting at least one of a temperature, a pressure and a duration of a deposition process used to form said layer of silicon nitride above said first oxide layer.

38. The method of claim 35, wherein adjusting at least one parameter of a process operation to be performed to form at least one of a layer of silicon nitride and a second layer of oxide above said first oxide layer based upon said measured capacitance of said first oxide layer comprises adjusting at least one of a temperature, a duration of a thermal growth process used to form said second layer of silicon oxide above said layer of silicon nitride.

39. A method, comprising:
performing at least one process operation to form a layer of silicon nitride above a first layer of oxide of an oxide-nitride-oxide stack of a memory cell;
measuring a capacitance of said layer of silicon nitride; and
adjusting at least one parameter of a process operation to be performed to form a second layer of oxide above said layer of silicon nitride based upon said measured capacitance of said layer of silicon nitride.

40. The method of claim 39, further comprising measuring a refractive index of said layer of silicon nitride.

41. The method of claim 39, wherein adjusting at least one parameter of a process operation to be performed to form said second layer of oxide above said layer of silicon nitride based upon said measured capacitance of said layer of silicon nitride comprises adjusting at least one of a temperature, a pressure and a duration of a thermal growth process used to form said second layer of oxide above said layer of silicon nitride.

42. A method, comprising:
   performing at least one process operation to form a first oxide layer, a layer of silicon nitride and a second oxide layer of an oxide-nitride-oxide stack of a memory cell;
   measuring a capacitance of said oxide-nitride-oxide stack; and
   adjusting at least one parameter of a process operation to be performed to form at least one layer of an oxide-nitride-oxide stack above a subsequently processed substrate based upon said measured capacitance of said measured oxide-nitride-oxide stack.

43. The method of claim 42, further comprising measuring a refractive index of said oxide-nitride-oxide stack.

44. The method of claim 42, wherein adjusting at least one parameter of a process operation to be performed to form at least one layer of an oxide-nitride-oxide stack to be formed above a subsequently processed substrate comprises adjusting at least one of a temperature, a pressure and a duration of a deposition process or a thermal growth process.

45. The method of claim 26, further comprising measuring an extinction coefficient of at least one of said first oxide layer, said layer of silicon nitride and said second layer of oxide.

46. The method of claim 26, further comprising measuring a flat band voltage of at least one of said first oxide layer, said layer of silicon nitride and said second layer of oxide.

47. The method of claim 26, further comprising measuring an extinction coefficient of a combination comprised of at least two of said first layer of oxide, said layer of silicon nitride and said second layer of oxide.

48. The method of claim 26, further comprising measuring a flat band voltage of a combination comprised of at least two of said first layer of oxide, said layer of silicon nitride and said second layer of oxide.

49. The method of claim 26, further comprising measuring an extinction coefficient of a combination comprised of said first layer of oxide, said layer of silicon nitride and said second layer of oxide.

50. The method of claim 26, further comprising measuring a flat band voltage of a combination comprised of said first layer of oxide, said layer of silicon nitride and said second layer of oxide.

* * * * *